United States Patent [19]

Kitchen

[11] Patent Number: 4,747,199

[45] Date of Patent: May 31, 1988

[54] METHOD OF SECURING MATING PARTS TOGETHER

[75] Inventor: Robert D. Kitchen, Freeport, Ill.

[73] Assignee: Honeywell Inc., Minneapolis, Minn.

[21] Appl. No.: 609,939

[22] Filed: May 14, 1984

Related U.S. Application Data

[62] Division of Ser. No. 435,133, Oct. 18, 1982, abandoned.

[51] Int. Cl.[4] .................. B29C 65/56; B23P 11/00; B21D 39/00
[52] U.S. Cl. .......................................... 29/416; 29/418; 29/450; 264/163; 264/249
[58] Field of Search .................. 264/163, 249; 29/416, 29/418, 450

[56] References Cited

U.S. PATENT DOCUMENTS

| | | | |
|---|---|---|---|
| 2,424,602 | 7/1947 | De Swart | 411/41 |
| 2,956,468 | 10/1960 | Macey | 411/41 |
| 3,203,304 | 8/1965 | Rapata | 411/41 |
| 3,232,161 | 2/1966 | Fernberg | 411/41 |
| 3,393,599 | 7/1968 | Fisher | 411/41 |
| 3,419,297 | 12/1968 | Diepenhorst et al. | 264/249 |
| 3,458,618 | 7/1969 | Burns et al. | 264/249 |
| 3,461,545 | 8/1969 | Bush | 264/249 |
| 3,513,509 | 5/1970 | Gross | 411/41 |
| 3,918,130 | 11/1975 | Poe | 411/41 |
| 4,081,641 | 3/1978 | Piber | 200/300 |
| 4,124,788 | 11/1978 | Kedian, Jr. | 200/51 R |
| 4,244,096 | 1/1981 | Kashichi | 264/249 |
| 4,288,670 | 9/1981 | Buttner | 200/300 |
| 4,479,915 | 10/1984 | Tsubonchi et al. | 264/249 |

FOREIGN PATENT DOCUMENTS

| | | |
|---|---|---|
| 48759 | 4/1977 | Japan . |
| 971370 | 9/1964 | United Kingdom . |
| 994424 | 6/1965 | United Kingdom . |
| 1122512 | 8/1968 | United Kingdom . |

Primary Examiner—James Lowe
Attorney, Agent, or Firm—Charles L. Rubow

[57] ABSTRACT

A method and structure for assembling plastic parts is disclosed wherein a first part is formed with integral projections and each including a tubular shank and a plug attached to the shank by a frangible web. A second part having apertures therein which mate with the projections is secured to the first part by displacing the plugs into the shanks which are thereby caused to expand.

5 Claims, 2 Drawing Sheets

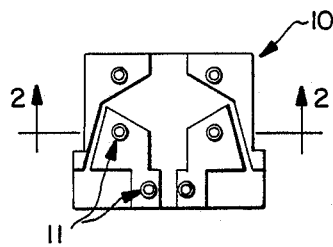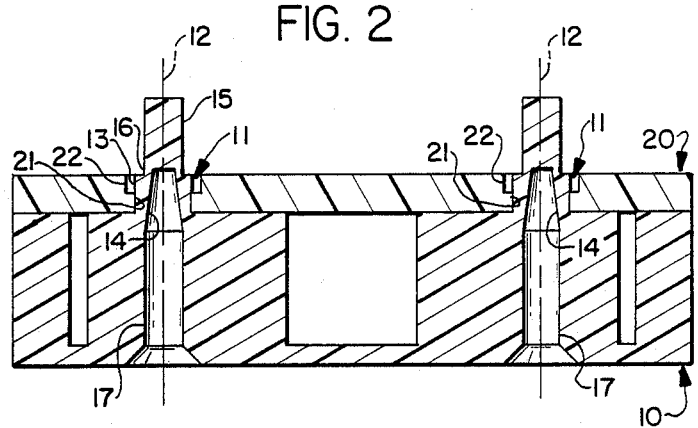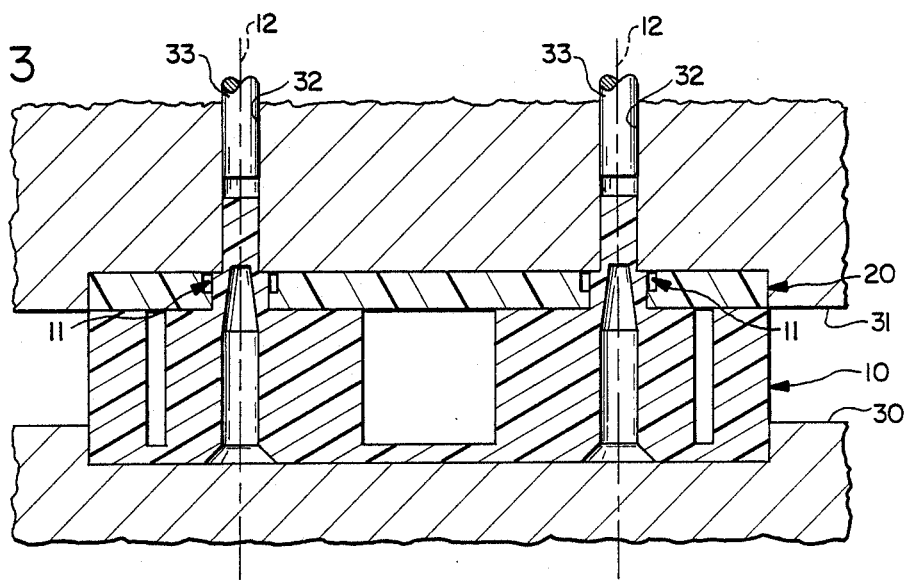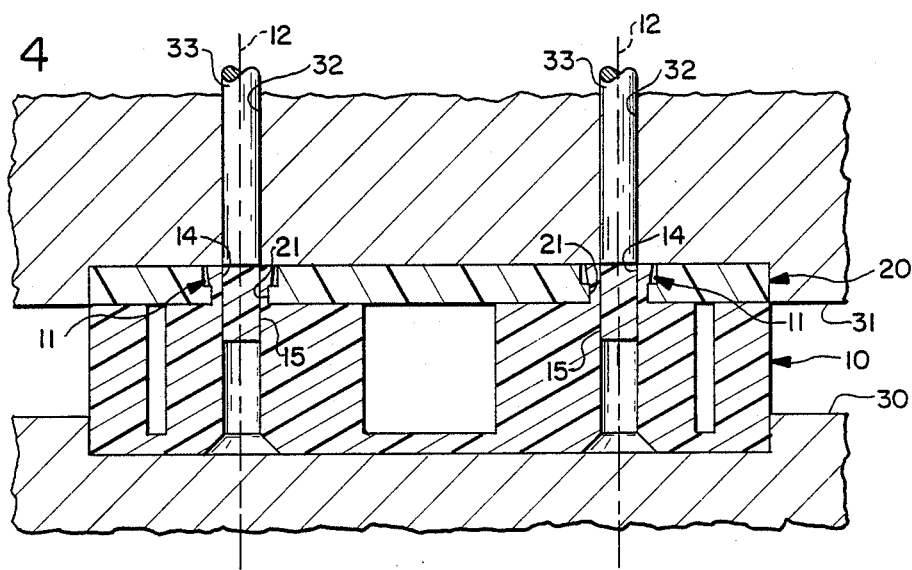

METHOD OF SECURING MATING PARTS TOGETHER

This application is a division, of application Ser. No. 435,133, filed Oct. 18, 1982 now abandoned.

BACKGROUND OF THE INVENTION

The invention disclosed herein relates generally to fastening methods and apparatus and more particularly to a method and structure for securing plastic parts together. The invention has been specifically adapted to assemble electrical switch cases.

Materials commonly referred to as plastics have been known and used for a considerable period of time in the manufacture and fabrication of structural devices and forms. Such materials are being increasingly widely used as new material compositions and forming and fabrication techniques become available. Factors which have contributed to the expansive use of plastics include the relatively low cost of plastic raw materials, and the facts that plastics are easily molded or otherwise formed, and that molding techniques are well developed for producing a vast range of configurations and sizes.

Since many applications of plastics require the securing of two or more parts together, a variety of fastening techniques and apparatus usable with plastic parts have been devised. These include conventional bolts, screws, rivets and adhesives. They also include more specialized methods such as hot swaging and ultrasonic welding. Nevertheless, there is a continued need for improved fastening apparatus and techniques in order to realize the potential advantages of plastics as structural materials.

An ideal fastening technique should have the following features: (1) The fastening means should be integrally formed with the parts to be assembled so as not to require separate fasteners or fastening substances. (2) The fastening process should not be accompanied by wasting of material or creation of waste or scrap. (3) The fastening process should not require more than simple well known tooling. (4) The fastening process should not require the use of heat. (5) The fastening process should require minimum time. (6) The fastening process should result in secure assembly of the parts.

The use of bolts, screws, rivets or adhesives undesirably involves the use of separate fasteners or fastening substances. The use of such fasteners and/or substances is further disadvantageous in that installation adds time to the assembly process. Hot swaging requires the use of heat. It is also a relatively slow process in that heat is required to be applied for a sufficient time to soften the plastic material. Ultrasonic welding basically involves the application of heat to fuse surfaces together, the heat being generated by the application of ultrasonic energy. It is also known that techniques such as ultrasonic welding, bonding and use of adhesives are not adequately effective on some plastic compositions.

The applicant has devised a novel, simple structure and process for quickly assembling plastic parts which does not require separate fasteners or fastening agents or complicated tooling, does not involve material waste, and produces very secure attachment. The process is applicable to parts fabricated of formable or ductile materials in accordance with the general definition of plastic. For purposes of the remainder of this description, plastic is intended to mean ductile or capable of being molded or formed.

SUMMARY OF THE INVENTION

The present invention is a structure and process for securing a first plastic part to another part or device. The structure comprises a plastic projection integrally formed on the first part and including a tubular portion having a tapered bore therein. A plug having a cross section larger than the cross section of at least a portion of the bore is connected by means of a frangible web to the tubular portion of the projection on either the first part or a separate substantially identical part. The plug is displaced into the bore in the tubular portion of the first part so as to expand the tubular portion after it has been inserted into a mating aperture in a part or device to which the first part is to be fastened. The first plastic part may be formed with a bore therethrough in communication with the bore in the tubular portion to provide a passageway for a plug which is integrally formed with a part other than the first part.

The method of assembling mating parts in accordance with the invention comprises forming first parts with plastic projections thereon, each projection including a tubular portion having a tapered bore therein and a plug having a cross section larger than the cross section of at least a portion of the bore, the plug being connected to the tubular portion by means of a frangible web. The method further comprises forming second parts with apertures therethrough adapted to mate with the projections on the first parts, positioning one each of the first and second parts together, and displacing a plug from one of the first parts so that the connecting web is ruptured and the plug is urged into the bore in the first part being assembled, thereby causing the tubular portion to expand and secure the projection in the mating aperture.

BRIEF DESCRIPTION OF THE DRAWINGS

FIG. 1 is a plan view of a plastic switch housing body having structure in accordance with the applicant's invention and designed for assembly with a cover part.

FIG. 2 is an enlarged cross sectional view of the body part of FIG. 1 taken along lines 2—2, and showing a mating cover part also in cross section;

FIG. 3 is a cross sectional view of the body and cover parts of FIG. 2 in a single station assembly fixture prior to assembly of the parts;

FIG. 4 is a view of the parts and assembly fixture of FIG. 3 after assembly of the parts;

DESCRIPTION OF THE PREFERRED EMBODIMENTS

Figures 5A, 5B, 5C, 5D, 5E:
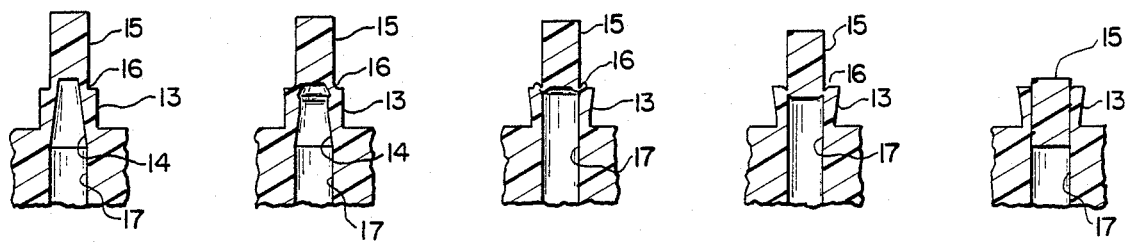
FIG. 5 illustrates in sequence an enlarged cross section of one of the projections on the body part of FIGS. 1-4 at various stages in the assembly process.

Reference numeral 10 in FIGS. 1-4, 6 and 7 generally identifies a plastic switch housing body part used for exemplifying the applicant's assembly structure and method. Body part 10 has a plurality of projections 11 thereon which are integrally molded with the remainder of the body part. As shown in FIGS. 2-4, 6 and 7, projections 11 extend along parallel axes 12. Each projection 11 comprises a tubular or hollow shank 13 with a tapered bore 14 therein. The cross section of tapered bore 14 decreases with distance along axis 12 from the bulk of body 10.

A slug or plug 15 is formed as an integral extension of each projection 11. Plug 15 is cylindrical and has a cross section larger than the cross section of at least a portion of bore 14. Plug 15 is connected to tubular shank 13 by means of a tubular frangible web 16. The interior surface of web 16 is substantially an extension of the interior surface of shank 13. As shown, the wall of web 16 is substantially thinner than the wall of shank 13. A bore or aperture 17 extends from each bore 14 through body 10 along axis 12 substantially as an extension of bore 14.

Also shown in FIGS. 2-4, 6 and 7 is a cover part 20 adapted to mate with body part 10. Cover part 20 has a plurality of apertures 21 therethrough positioned to mate with projections 11 on body part 10. Apertures 21 are formed with counterbores 22 on the side of cover 20 opposite body 10. As will be explained hereinafter, counterbores 22 provide clearance for expansion of tubular shanks 13 when the outer ends of the shanks are substantially flush with the exterior of the assembled body and cover parts.

FIG. 3 illustrates a body 10 and cover 20 mated in a single station fixture prior to assembly. As illustrated, the fixture comprises a support base or plate 30 on which body 10 is supported. A pressure plate 31 is shown for holding cover 20 properly positioned on body 10. Pressure plate 31 has a plurality of apertures 32 therethrough corresponding to the number and location of projections 11 on body part 10. Each of apertures 32 contains a plunger 33 which is moveable along axis 12.

As shown in FIG. 4, plungers 33 have moved so as to displace plugs 15 to the interior of bores 14. Since the cross section of each bore 14 along at least a portion of its length is smaller than the cross section of plug 15, the outer end of shank 13 is caused to expand and prevent the shank from pulling through the associated aperture 21 in cover 20.

A better understanding of the interaction of shank 13, plug 15 and frangible web 16 as the plug is pressed into the shank can be obtained from the series of cross sectional views shown in FIG. 5. The illustration of FIG. 5(a) shows the shank 13, plug 15 and web 16 in original molded condition. In FIG. 5(b) plug 15 has begun to be displaced, and through action of web 16, has begun to expand the end of shank 13. In FIG. 5(c), the end of plug 15 has begun to enter bore 14 in shank 13, and concurrently therewith, web 16 has buckled around the circumference of the plug. In FIG. 5(d), plug 15 has been displaced to the extent that web 16 is stretched between the inner end of the plug and the outer end of shank 13. In FIG. 5(e) web 16 has ruptured or separated and plug 15 has been displaced to the extent that its outer end is substantially flush with the outer end of shank 13. The outer end of shank 13 is, accordingly, maintained in an expanded condition.

The foregoing process is simply accomplished by applying axial force to the plug. The force can be applied by means of a simple press and fixture. No heat is required. No unused material, such as excess flashing, for connecting parts is required or requires disposal. The operation can be quickly accomplished. Finally, once the plug is in place, the assembled parts are very securely mechanically locked together.

Figure 6:
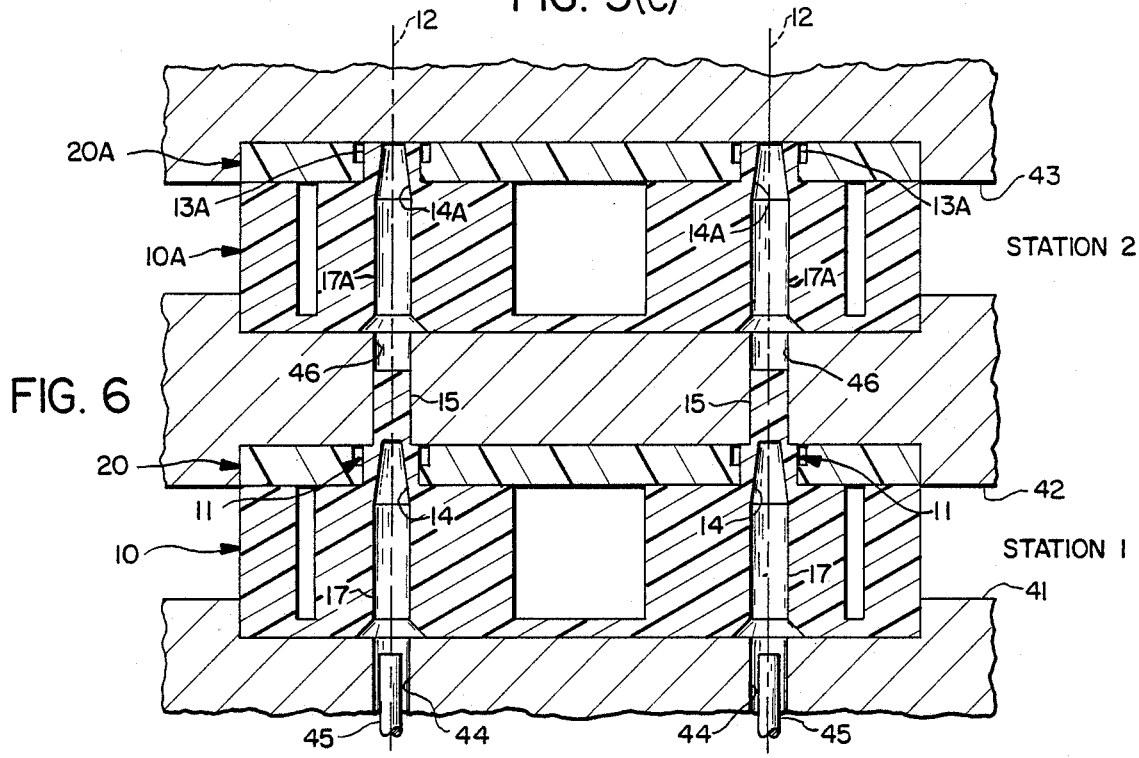
FIG. 6 is a cross sectional view of a two station assembly fixture with two mated body and cover parts in place prior to the assembly operation.
Figure 7:
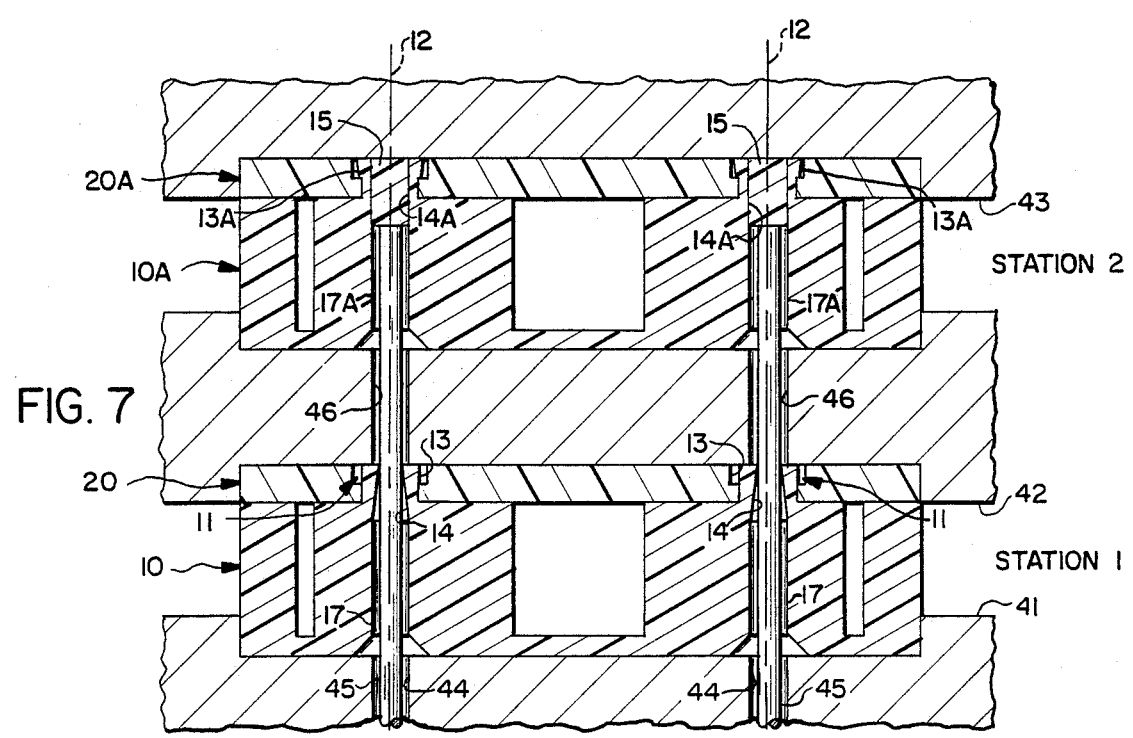
FIG. 7 is a cross sectional view of the parts and assembly fixture of FIG. 6 after the assembly operation.

FIGS. 6 and 7 illustrate an alternative two station assembly process and fixture. As shown, there is a first station between a support base or plate 41 and a first surface on an intermediate pressure plate 42. A second station is located between a second surface on intermediate pressure plate 42 and an outer pressure plate 43. The first and second stations are located so that corresponding elements of the parts in the stations are aligned along axes 12. Base 41 has apertures 44 therein aligned with axes 12, and containing plungers 45 movable along the axes. Intermediate pressure plate 42 contains apertures 46 also aligned with axes 12.

In the two stage assembly process, an unassembled body 10 and cover 12 are positioned in Station 1 and a body 10A and cover 20A, which had previously been through the operation in Station 1, are positioned in Station 2. As will be apparent from the following discussion, while previously located in Station 1, the plugs on the projections on body 10A were severed therefrom and displaced into an assembly then in Station 2. During the current operation, plungers 45 are moved through apertures 17 and tapered bores 14 in body 10. Continued movement of plungers 45 shears plugs 15 from shanks 13 and moves them through apertures 46 in intermediate pressure plate 42, apertures 17A in body part 10A and into the tapered bores in shanks 13A. Since the cross section of each plug 15 is larger than at least a portion of the cross section of associated bore 14A, the outer end of corresponding shank 13A is caused to expand as shown in FIG. 7, thus securing cover part 20A in place on body part 10A.

Thereafter, the same process is repeated by withdrawing plungers 45, removing the completed assembly of parts 10A and 20A from Station 2, moving parts 10 and 20 from Station 1 to Station 2, and positioning unprocessed parts corresponding to parts 10 and 20 into Station 1 for the next operation of plungers 45.

The foregoing abbreviated description sets forth the essential operations of a two stage assembly process in accordance with the applicant's invention. The specific operations may be achieved in a variety of ways, and may be part of a continuous automated process.

A single embodiment of plastic parts structured in accordance with the applicant's invention, along with two variations of a method for assembling the parts have been shown and described in detail for exemplary purposes. Other embodiments and variations thereof which do not depart from the applicant's teachings will be apparent to those skilled in the relevant arts. It is not intended that coverage be limited to the illustrated embodiment and method, but only by the terms of the following claims.

The embodiments of the invention in which an exclusive property or right is claimed are defined as follows:

1. A method of securing mating parts together, comprising:
   forming a plurality of body parts with a plurality of integral plastic projections thereon, each projection extending along an axis and including a tubular portion having a tapered bore therein whose cross section decreases with distance away from the body part, a plug having a cross section perpendicular to the axis larger than the cross section of at least a portion of the bore, and a frangible web axially connecting said plug to the end of said tubular portion remote from the body;
   forming a plurality of cover parts with a plurality of apertures therethrough adapted to mate with the plurality of projections on said plurality of body parts;

positioning a first one each of said body and cover parts together in a mating relationship; and displacing at least one of said plugs so that its connecting web is ruptured and the plug is urged into the bore in the tubular portion of a plastic projection of said first body part, thereby causing said tubular portion to expand and secure said projection in the mating aperture.

2. The method of claim 1 wherein the step of displacing at least one of said plugs comprises displacing the plug of a plastic projection on said first body part into the tubular portion of the same projection.

3. The method of claim 1 wherein the step of displacing at least one of said plugs comprises displacing the plug of a plastic projection on a body part other than said first body part into the tubular portion of a plastic projection on said first body part.

4. The method of claim 3 wherein the plug of said projection on said first body part is separated from the projection on which it is formed before the plug of said projection on a body part other than said first body part is displaced into the tubular portion of said projection on said first body part.

5. The method of claim 3 or 4 wherein the plug displaced into the tubular portion of said projection on the first body part is passed through a bore in said first body part in communication with the bore in the tubular portion of said projection on said first body part.

* * * * *